(12) United States Patent
Urabe

(10) Patent No.: US 6,225,213 B1
(45) Date of Patent: *May 1, 2001

(54) MANUFACTURING METHOD FOR CONTACT HOLE

(75) Inventor: Koji Urabe, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/010,578

(22) Filed: Jan. 22, 1998

(30) Foreign Application Priority Data

Jan. 23, 1997 (JP) .................................................. 9-010389

(51) Int. Cl.⁷ ........................ H01L 21/4763; H01L 21/44
(52) U.S. Cl. ..................... 438/627; 438/643; 438/648; 438/680
(58) Field of Search .................................... 438/648, 656, 438/680, 685, 627, 628, 629, 643, 644; 257/763, 770; 427/255.1, 255.2

(56) References Cited

U.S. PATENT DOCUMENTS

| | | | |
|---|---|---|---|
| 5,173,327 | * 12/1992 | Sandhu et al. | 427/573 |
| 5,175,017 | * 12/1992 | Kobayashi et al. | 427/8 |
| 5,508,066 | * 4/1996 | Akahori | 427/571 |
| 5,567,243 | * 10/1996 | Foster et al. | 118/730 |
| 5,595,784 | * 1/1997 | Kaim et al. | 427/255.2 |
| 5,780,356 | * 7/1998 | Kim | 438/627 |

FOREIGN PATENT DOCUMENTS

| | | |
|---|---|---|
| 5-259110 | 10/1993 | (JP) . |
| 7-41948 | 2/1995 | (JP) . |
| 8-283944 | 10/1996 | (JP) . |
| 10-12725 | 1/1998 | (JP) . |

* cited by examiner

Primary Examiner—T. N. Quach
(74) Attorney, Agent, or Firm—Young & Thompson

(57) ABSTRACT

A manufacturing method for a semiconductor device includes the steps of: forming an insulating film on a silicon substrate; removing a predetermined portion of the insulating film and forming a contact hole wherein the silicon substrate is exposed; and depositing a titanium film on the exposed silicon substrate and the insulating film by setting the temperature of the substrate at 550 degrees Celsius or higher and by employing plasma chemical vapor deposition using halogenated titanium, $H_2$, a gas containing halogen and a carrier gas.

6 Claims, 4 Drawing Sheets

TiN FILM ← 7

MANUFACTURING METHOD FOR CONTACT HOLE

BACKGROUND OF THE INVENTION

1. Field of the Invention

The present invention relates to a manufacturing method for a contact hole and, more particularly, to a manufacturing method for a contact hole, which method includes a step for forming a Ti film by employing chemical vapor deposition.

2. Description of the Related Art

Great efforts are being continued for achieving smaller semiconductor devices with higher density. Currently, VLSI semiconductor devices such as memory devices or logic devices designed with a dimensional standard of about 0.15 µm are being developed and their prototypes are being made. With such increasing scale of integration of semiconductor devices, the diameters of contact holes are accordingly being made even smaller; however, it is difficult to reduce the depths of contact holes because of the need for wiring resistance or capacity. For this reason, the aspect ratios of contact holes are rapidly increasing in recent years, and there has been high demand for forming metal electrodes featuring good coverage.

Referring now to FIG. 1, a conventional method for forming a metal film by the chemical vapor deposition will be described. FIG. 1A through FIG. 1C are cross-sectional views illustrative of the steps wherein the ECR plasma chemical vapor deposition is applied to form a barrier metal film on a contact hole.

First, a contact hole 3 is opened on a 1000 nm-thick insulating film 2 on a silicon substrate 1 as illustrated in FIG. 1A. Then, as illustrated in FIG. 1B, a Ti film 5 is formed to a thickness of a few nanometers on the substrate by using an ECR plasma apparatus under a condition wherein the $TiCl_4$ flow is 24 sccm, the $H_2$ flow is 30 sccm, the pressure is 0.12 Pa, the microwave power is 2.8 kW, and the film forming temperature is 420 degrees Celsius. In the next step, as shown in FIG. 1C, a TiN film 7 is formed on the substrate in succession by using the same apparatus under a condition wherein the TiCl4 flow is 20 scam, the $H_2$ flow is 26 sccm, the N2 flow is 6 sccm, the pressure is 0.23 Pa, the microwave power is 2.8 kW, and the film forming temperature is 420 degrees Celsius. In the conventional example, the flow ratio of $TiCl_4$ to $H_2$ is controlled to 0.4 or more so as to suppress the spiculate growth of the Ti film, thereby enhancing the flatness of the film surface to improve the step coating property thereof.

In the conventional manufacturing method for a semiconductor device described above, however, the Ti depositing speed depends on the dose of each reactive species rather than the base substrate; therefore, the step coating property of the Ti film heavily depends on the geometrical shape of the substrate. For this reason, a sufficient thickness of the Ti film cannot be obtained at the bottom of the contact hole having a high aspect ratio, so that stable electrical characteristics of a contact electrode cannot be obtained.

SUMMARY OF THE INVENTION

Accordingly, it is an object of the present invention to provide a manufacturing method of a contact hole, which method permits improved Ti coverage on the bottom portion of a contact hole and enables stable formation of a contact electrode even for a contact hole with a high aspect ratio.

To this end, according to the present invention, there is provided a manufacturing method for a semiconductor device, which method includes the steps of: forming an insulating film on a silicon substrate; removing a predetermined portion of the insulating film to form a contact hole where the silicon substrate is exposed; and depositing a titanium film on the exposed silicon substrate and the insulating film by plasma chemical vapor deposition by employing a halogenated titanium, $H_2$, a gas containing halogen and a carrier gas, with the substrate temperature set at 550 degrees Celsius or more.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DESCRIPTION OF THE PREFERRED EMBODIMENTS

Figure 1A:
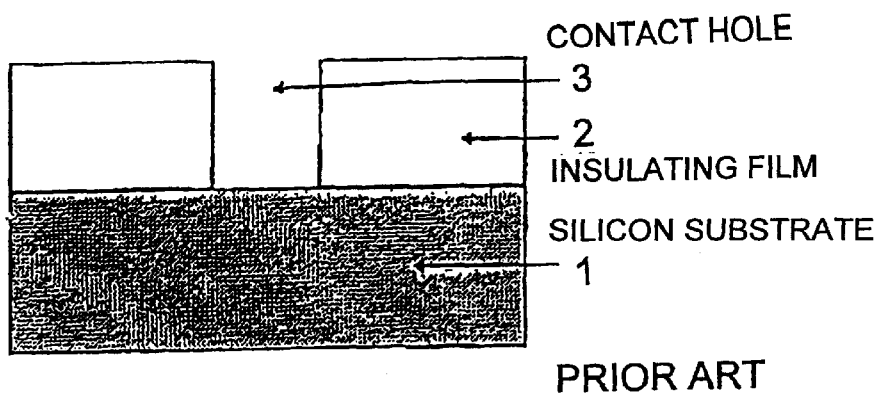
FIG. 1A through FIG. 1C are cross-sectional views illustrating the conventional steps arranged in sequence for forming a barrier metal layer on a contact hole.
Figure 1B:
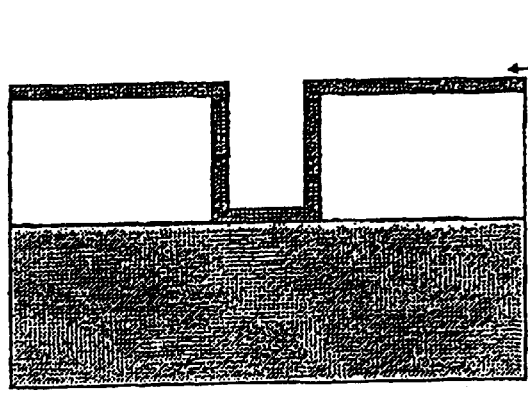
Figure 1C:
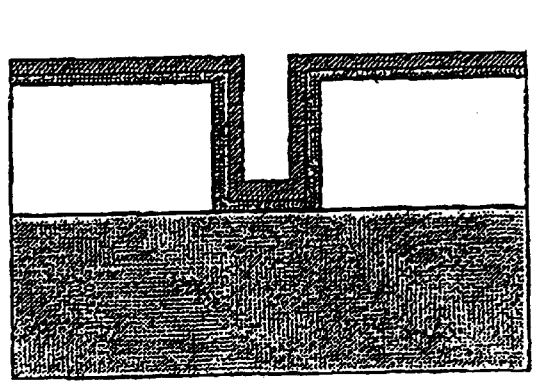
Figure 2A:
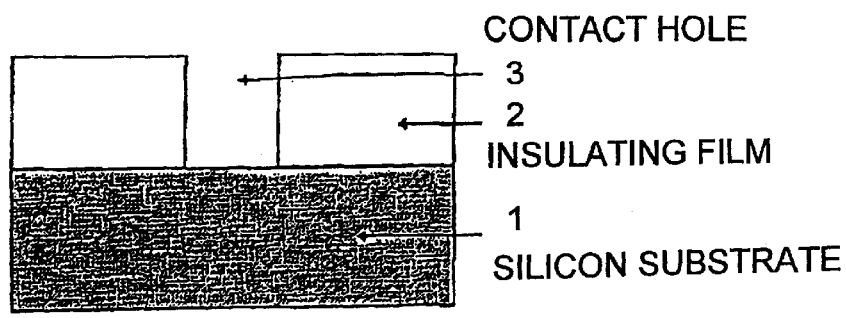
FIG. 2A through FIG. 2D are cross-sectional views of the steps arranged in sequence to illustrate the invention.

Referring now to the accompanying drawings, a first embodiment of the invention will be explained. First, a 2 µm-thick insulating film 2 is deposited on a silicon substrate 1 whereon a semiconductor device has been formed, then a contact hole 3 having a diameter of 0.30 µm is opened in the insulating film 2 as shown in FIG. 2A. In the following step, a Ti film is deposited using the chemical vapor deposition based on plane parallel type plasma discharge under a condition where: a mixed gas consisting of 2 sccm of $TiCl_4$, 1000 sccm of $H_2$, and 500 sccm of Ar is used as the raw material gas; the temperature of the substrate is 600 degrees Celsius: the pressure is 3 torr; and the high-frequency discharge output is 500 kW. Thus, a 10 nm-thick Ti film 5 is deposited on the insulating film 2, and a 20 nm-thick Ti silicide film 4 is deposited on the silicon substrate 1.

Figure 3:
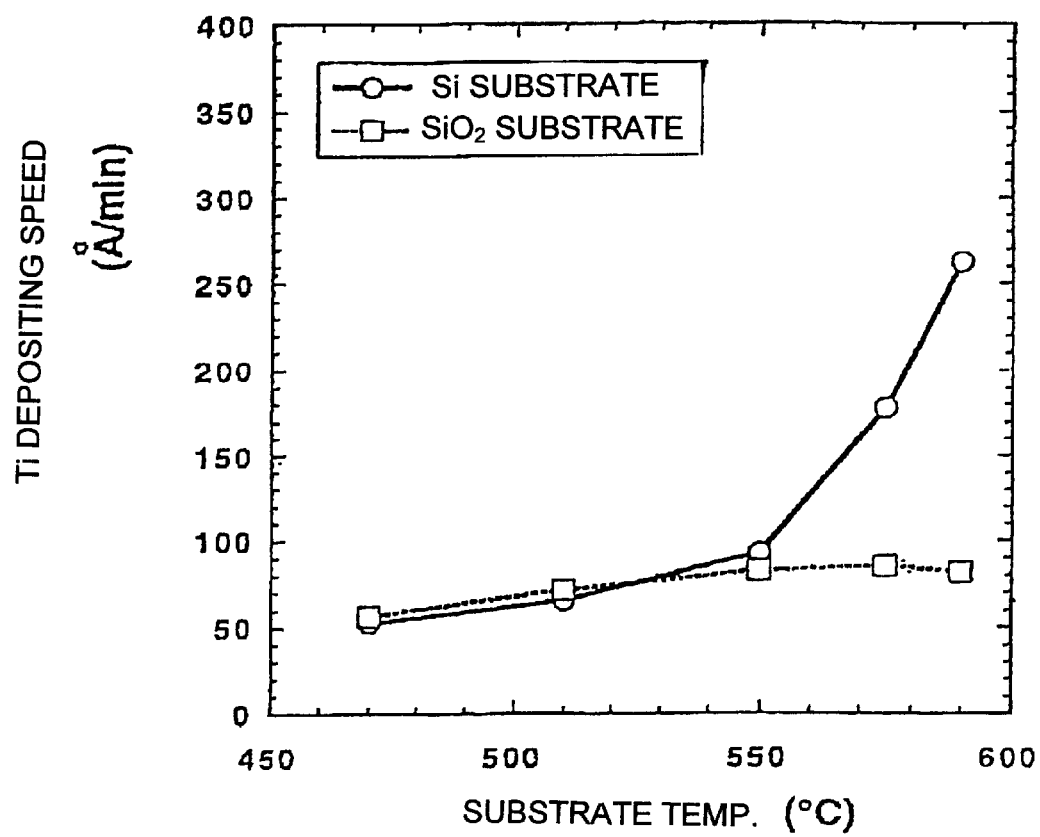
FIG. 3 is a diagram showing the dependence of Ti depositing speed on the temperature of a substrate.

In this embodiment, the temperature of the substrate at the time of forming the Ti film is 550 degrees Celsius or higher; the reason will be explained with reference to the accompanying drawings. FIG. 3 shows the dependence of the Ti depositing speed on temperature when the chemical vapor deposition based on the plane parallel plasma discharge is employed on a silicon substrate and a silicon oxide film.

As it is obvious from the graph, if the temperature of the substrate is lower than 550 degrees Celsius, then no noticeable difference is observed in the Ti depositing speed between the deposition on the silicon substrate and that on the silicon oxide film. This means that there is no noticeable difference in the Ti depositing speed between the deposition on the bottom portion of the contact hole and the insulating film. Hence, the film thickness of each portion of the contact hole depends on the geometrical shape thereof, the bottom portion of the contact hole being thinner.

Figure 4:
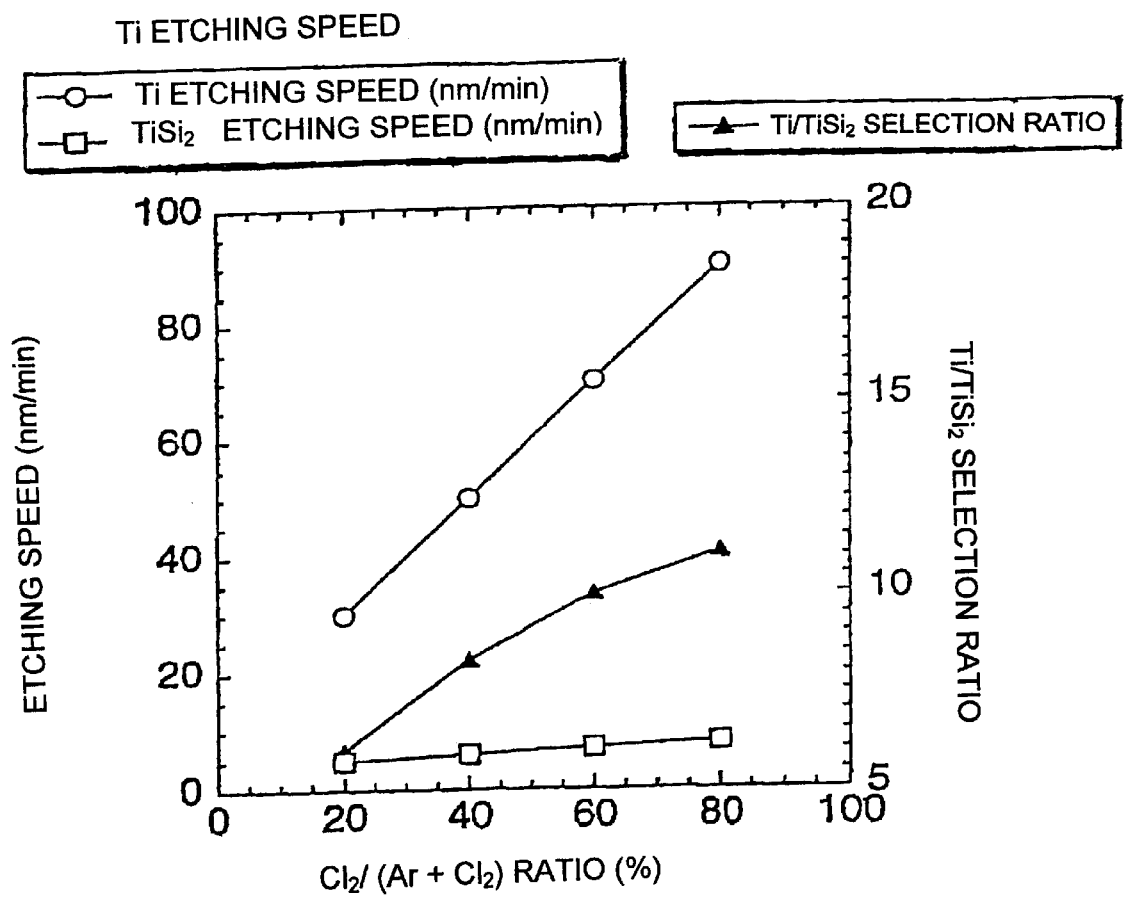
FIG. 4 is a diagram showing the dependence of Ti to $TiSi_2$ etching selection ratio on the partial pressure of chlorine.

If the temperature of the substrate is 550 degrees Celsius or higher, then the amount of silicon supplied to the surface of the silicon substrate increases, causing the Ti film formed on the bottom portion of the contact hole to quickly turn into silicide. FIG. 4 shows the plasma etching speed on the Ti film and the Ti silicide film observed when the gas containing chlorine is used. The comparison under the same condition clearly indicates that the Ti film is etched more easily than the Ti silicide film. Hence, in the process of the Ti deposition by the plane parallel plasma chemical vapor deposition, the Ti film formed on the insulating film is etched by a gas containing chlorine such as $TiCl_x$ of a reactive species or HCl or $Cl_2$ of a product, whereas the Ti silicide film formed on the bottom portion of the contact hole is difficult to be etched.

Thus, it is obvious that setting the temperature of the substrate at 550 degrees or more increases the speed of the Ti deposition on the silicon substrate as compared with that on the insulating film, enabling the advantage of the invention to be implemented. There is no particular restrictions on the upper limit of the temperature of the substrate; however, it is desirable to set the temperature to, for example, 850 degrees Celsius or less at which no diffusion of impurities takes place during the Ti deposition.

In this embodiment, a halogenated titanium is employed as the raw material gas for producing the Ti film. The halogenated titanium includes, for example, $TiCl_4$ and $TiI_4$.

Figure 2B:
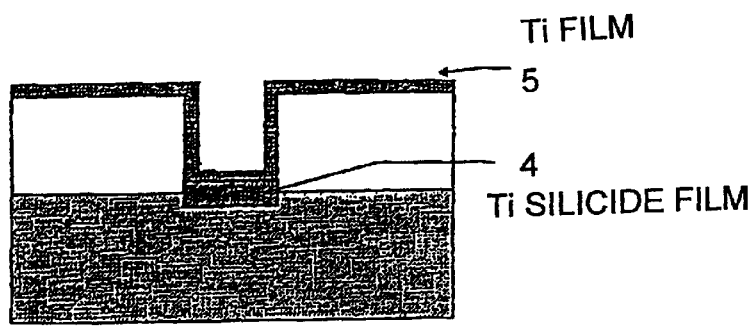
Figure 2C:
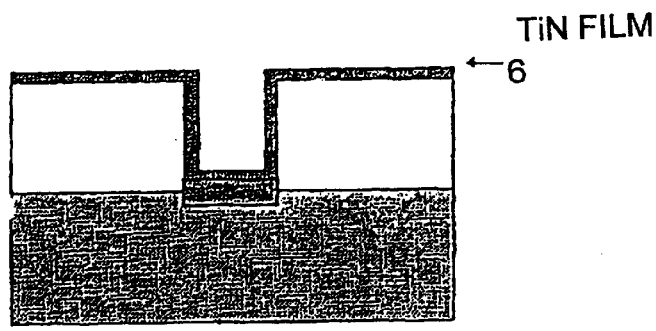
Figure 2D:
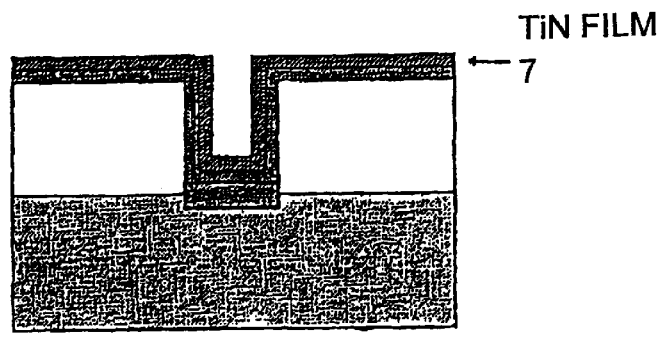

In the next step, as shown in FIG. 2C, a TiN film 6 is formed by nitriding the Ti film 5 on the insulating film 4 in a chamber different from the chamber where the Ti deposition was carried out. The nitriding is performed at the $NH_3$ flow of 100 sccm, the substrate temperature of 600 degrees Celsius, a pressure of 20 torr, and a high-frequency discharge output of 500 kW. Then, a 50 nm-thick TiN film 7 is formed on the TiN film 6 by the chemical vapor deposition in the same reaction chamber where the Ti nitriding was conducted (see FIG. 2D). The TiN filn 7 is produced using a mixed gas consisting of 40 sccm of TiCl4, 1000 sccm of $NH_3$, and 3000 sccm of nitrogen, at a substrate temperature of 600 degrees Celsius and under a pressure of 20 torr.

According to the manufacturing method for a semiconductor device shown in this embodiment, the speed of Ti deposition on the silicon substrate is higher than that on the insulating film, thus enabling a sufficiently thick Ti film to be formed on the bottom portion of the contact hole formed on the silicon substrate. This ensures markedly stable electrical characteristics of the contact electrode.

A second embodiment of the invention will now be explained. The second embodiment is different from the first embodiment in the step for forming the Ti film shown in FIG. 2B; the rest of the process is the same as that in the first embodiment, so that the explanation thereof will be omitted.

In the second embodiment, as shown in FIG. 2B, the silicide film 4 is deposited by employing the chemical vapor deposition based on the plane parallel plasma discharge, using a mixed gas consisting of a 2-sccm flow of $TiCl_4$, a 1000-sccm flow of $H_2$, and a 500-sccm flow of Ar as the raw material gas, and 2 sccm of a chlorine gas is added thereto; the temperature of the substrate is 550 degrees Celsius, the pressure is 3 torr, and the high-frequency discharge output is 500 kW. The addition of the chlorine gas increases the etching speed so as to lower the forming speed of the Ti film on the insulating film, thereby making it possible to relatively increase the speed of Ti deposition on the silicon substrate. Under the foregoing condition, the 10 nm-thick Ti film 5 is deposited on the insulating film 2 and the 20 nm-thick Ti silicide film 4 is deposited on the silicon substrate 1.

In this embodiment, additionally using a gas containing halogen when depositing Ti further increases the difference in the Ti depositing speed between the deposition on the bottom portion of the contact hole and that on the insulating film, so that further greater advantage may be obtained. FIG. 4 shows the plasma etching speed on the Ti film and the Ti silicide film when a gas containing chlorine is used. It can be seen that adding the partial pressure of chlorine increases the difference in the Ti depositing speed between the deposition on the silicon substrate and that on the silicon oxide film, i.e. the difference in the Ti depositing speed between the deposition on the bottom portion of the contact hole and that on the insulating film.

Hence, further adding a gas containing halogen to a reactive gas increases the etching speed so as to lower the forming speed of the Ti film on the insulating film, thereby making it possible to relatively increase the speed of Ti deposition on the silicon substrate. The gas containing halogen refers to a halogen gas or a halogen compound gas used in addition to the halogenated titanium serving as the raw material gas. For example, a gas of chlorine, chlorine compound, fluorine, fluorine compound, bromine, bromine compound, etc. may be used; it is especially desirable to use a gas which contains $Cl_2$, HCl, HBr or $F_2$ because such a gas increases the difference in the Ti depositing speed between the deposition on the bottom portion of a contact hole and that on the insulating film, enabling a sufficiently thick Ti film to be formed on the bottom portion of the contact hole.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A manufacturing method for a semiconductor device, which manufacturing method comprising:

forming an insulating film on a silicon substrate;

forming a contact hole in said insulating film wherein said silicon substrate is exposed; and depositing a titanium film on said exposed silicon substrate and said insulating film by setting the temperature of said substrate at 550 degrees Celsius or higher and by employing plasma chemical vapor deposition using halogenated titanium, $H_2$, a gas containing halogen, and a carrier gas.

2. A manufacturing method for a semiconductor device according to claim 1, wherein said gas containing halogen contains a gas of $Cl_2$, HCl, HBr, or $F_2$.

3. A manufacturing method for a semiconductor device according to claim 1, wherein said halognated titanium is $TiCl_4$.

4. A manufacturing method for a semiconductor device according to claim 1, wherein said substrate temperature is 850 degrees Celsius or lower.

5. A manufacturing method for a semiconductor device according to claim 6, further comprising the steps of forming a first titanium nitride layer on said insulating film by nitriding said insulating film; and depositing a second titanium nitride film on said first titanium nitride film by employing chemical vapor deposition using halogenated titanium and ammonia.

6. A manufacturing method for a semiconductor device according to claim 5, wherein said first titanium nitride film is formed by using ammonia gas in a chamber different from a chamber where said titanium film deposition is carried out.

* * * * *